United States Patent
Joo et al.

(10) Patent No.: US 7,889,564 B2
(45) Date of Patent: Feb. 15, 2011

(54) SEMICONDUCTOR MEMORY DEVICE INCLUDING MEMORY CELL ARRAY HAVING DYNAMIC MEMORY CELL, AND SENSE AMPLIFIER THEREOF

(75) Inventors: Han-Sung Joo, Seoul (KR); Jae-Wook Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/461,746

(22) Filed: Aug. 24, 2009

(65) Prior Publication Data

US 2010/0046310 A1 Feb. 25, 2010

(30) Foreign Application Priority Data

Aug. 22, 2008 (KR) .................. 10-2008-0082517

(51) Int. Cl.
*G11C 16/06* (2006.01)
(52) U.S. Cl. .................. 365/185.21; 365/196; 365/205; 365/207
(58) Field of Classification Search ............ 365/185.21, 365/196, 205, 207
See application file for complete search history.

(56) References Cited

U.S. PATENT DOCUMENTS

| | | | |
|---|---|---|---|
| 7,145,811 B2 | 12/2006 | Ohsawa | |
| 2006/0181917 A1 * | 8/2006 | Kang et al. | 365/149 |
| 2007/0127289 A1 | 6/2007 | Lee | |
| 2007/0217269 A1 | 9/2007 | Fujita | |
| 2007/0217289 A1 | 9/2007 | Watabe et al. | |

FOREIGN PATENT DOCUMENTS

| | | |
|---|---|---|
| JP | 2005-302234 | 10/2005 |
| JP | 2007-157322 | 6/2007 |
| JP | 2007-250153 | 9/2007 |
| KR | 10-0663368 | 12/2006 |

* cited by examiner

*Primary Examiner*—Hoai V Ho
*Assistant Examiner*—Jason Lappas
(74) *Attorney, Agent, or Firm*—Harness, Dickey & Pierce, P.L.C.

(57) ABSTRACT

A semiconductor memory device and a sense amplifier thereof are provided. The semiconductor memory device includes a memory cell array and a plurality of sense amplifiers. The memory cell array includes a memory cell array block having a plurality of memory cells. Each of the plurality of sense amplifiers is configured to apply, based on a restore signal, a first voltage to a corresponding bit line to restore a first data value in a selected memory cell of the plurality of memory cells if a read value in the selected memory cell is the first data value and apply a second voltage based on the restore signal to the corresponding bit line to prevent a second data value from being restored in the selected memory cell if the read value in the selected memory cell is the second data value.

20 Claims, 6 Drawing Sheets

SEMICONDUCTOR MEMORY DEVICE INCLUDING MEMORY CELL ARRAY HAVING DYNAMIC MEMORY CELL, AND SENSE AMPLIFIER THEREOF

CROSS-REFERENCE TO RELATED APPLICATION

This application claims priority to Korean Patent Application No. 10-2008-0082517, filed Aug. 22, 2008, the entire contents of which are herein incorporated by reference.

BACKGROUND

1. Field

Example embodiments relate to a semiconductor memory device, and more particularly, to a semiconductor memory device including a memory cell array that includes dynamic memory cells and a sense amplifier of the semiconductor memory device.

2. Description of Related Art

Conventional memory cell arrays may include dynamic memory cells that use floating body transistors. Efforts are ongoing to achieve high-speed operation and excellent data retention characteristics in a conventional memory cell array by using a bipolar junction transistor operation of the floating body transistors.

In the dynamic memory cells that use floating body transistors, majority carriers that are accumulated in the floating body of each dynamic memory cell are removed after a period of time has elapsed. In order to maintain data stored in the dynamic memory cells, a refresh operation must be performed on the dynamic memory cells. In addition, a restore operation is performed after a read operation.

SUMMARY

Example embodiments provide a semiconductor memory device that can selectively perform a restore operation or a refresh operation on memory cells in which data "0" is stored when the restore operation is performed after a read operation or the refresh operation.

Example embodiments also provide a sense amplifier of the semiconductor memory device.

Some example embodiments are directed to a semiconductor memory device including a memory cell array including: a memory cell array block having a plurality of memory cells respectively connected between a plurality of word lines, a plurality of source lines and a plurality of bit lines and having floating body transistors and a plurality of sense amplifiers respectively connected to the bit lines. Each of the sense amplifiers amplifies a signal of a corresponding bit line and outputs the amplified signal to a data input/output line during a read operation, applies a first voltage to the corresponding bit line so that data "0" is restored to a memory cell selected from among the memory cells when a state of the data input/output line is a state corresponding to a data "0" state, and applies a second voltage that is higher than the first voltage to the selected memory cell so that restoration of data "1" to the selected memory cell is prevented when the state of the data input/output line is a state corresponding to a data "1" state.

Each of the sense amplifiers may apply the first voltage to the corresponding bit line so that data "0" is written to the selected memory cell, and apply a third voltage that is lower than the first voltage to the corresponding bit line so that data "1" is written to the selected memory cell.

Each of the memory cells may be configured such that data is written thereto and read therefrom by current caused by a bipolar junction operation.

Each of the sense amplifiers may include a read block configured to amplify a voltage of the corresponding bit line and output the amplified voltage to the data input/output line in response to a read enable signal during the read operation and precharge the corresponding bit line to a ground voltage in response to both the read enable signal and a precharge signal during a precharge operation. Each of the sense amplifiers may further include a restore block configured to apply the first or second voltage to the corresponding bit line according to the voltage of the data input/output line in response to a restore signal during the restore operation and a write block configured to apply the first or third voltage to the corresponding bit line according to the voltage of the data input/output line in response to a write enable signal during a write operation.

The read block may include a transmission gate configured to connect the corresponding bit line with a first node in response to the read enable signal, a precharger configured to precharge the first node to the ground voltage and a second node to a precharge voltage in response to the precharge signal and a sensor configured to amplify a signal of the first node and output the amplified signal to the data input/output line.

The transmission gate may include a first NMOS transistor connected between the corresponding bit line and the first node and having a gate to which the read enable signal is applied. The precharger may include a second NMOS transistor connected between the first node and a terminal to which the ground voltage is applied and having a gate to which the precharge signal is applied, a first inverter configured to invert and output the precharge signal and a first PMOS transistor connected between a terminal to which precharge voltage is applied and the second node and having a gate to which the output signal of the first inverter is applied. The sensor may include a third NMOS transistor connected between the second node and a terminal to which the ground voltage is applied and having a gate to which the signal of the first node is applied and a second inverter connected between the second node and the data input/output line to invert, amplify and output a signal of the second node.

The restore block may include a fourth NMOS transistor connected between the corresponding bit line and a third node and having a gate to which the restore signal is applied, a second PMOS transistor connected between the third node and a terminal to which the first voltage is applied and having a gate to which a signal of the data input/output line is applied and a fifth NMOS transistor connected between the third node and a terminal to which the second voltage is applied and having a gate to which the signal of the data input/output line is applied.

The write block may include a sixth NMOS transistor connected between the corresponding bit line and a fourth node and having a gate to which the write enable signal is applied, a third PMOS transistor connected between the fourth node and a terminal to which the first voltage is applied and having a gate to which a signal of the data input/output line is applied and a seventh NMOS transistor connected between the fourth node and a terminal to which the third voltage is applied and having a gate to which the signal of data input/output line is applied.

The semiconductor memory device may further include a controller configured to control the word lines and the source lines in response to a write command, a read command, and an address signal received from outside, and output the read enable signal, the precharge signal, the write enable signal, and the restore signal.

The controller may perform the write operation in a first period for the write operation by applying a fourth voltage to a selected word line, applying a fifth voltage that is higher than the fourth voltage to a selected source line, and activating the write enable signal, and perform the precharge operation in a second period for the write operation by applying a sixth voltage that is lower than the fourth voltage to the selected word line, applying the fourth voltage to the selected source line, and activating the read enable signal and the precharge signal. The controller may perform the read operation in a first period for the read and restore operations by applying the sixth voltage to the selected word line, applying the fifth voltage to the selected source line, and activating the read enable signal. The controller may perform the restore operation in a second period for the read and restore operations by applying the fourth voltage to the selected word line, applying the fifth voltage to the selected source line, and activating the restore signal. The controller may perform the precharge operation in a third period for the read and restore operations by applying the sixth voltage that is lower than the fourth voltage to the selected word line, applying the fourth voltage to the selected source line, and activating the read enable signal and the precharge signal.

The controller may sequentially perform the read and restore operations on memory cells that are connected to one or more word lines among the plurality of word lines when a refresh command received from outside is activated or when a refresh period is started.

Each of the sense amplifiers may prevent data from being written to the corresponding memory cell by applying the second voltage to the corresponding bit line in response to an inhibit signal.

The sense amplifiers may include an eighth NMOS transistor which is connected between the corresponding bit line and a terminal to which the second voltage is applied and has a gate to which the inhibit signal is applied.

The controller may activate the inhibit signal output to a sense amplifier connected to a bit line of at least one non-selected memory cell during the write operation.

Other example embodiments are directed to a sense amplifier including a read block configured to amplify a voltage of a bit line connected to a memory cell having a floating body transistor and output the amplified voltage to a data input/output line during a read operation and precharge the bit line to a ground voltage during a precharge operation. The sense amplifier further includes a restore block configured to apply a first voltage to the bit line in response to a voltage of the data input/output line so that data "0" is restored to the memory cell, or apply a second voltage that is higher than the first voltage to the bit line so that restoration of data "1" to the memory cell is prevented, during a restore operation, and a write block configured to apply the first voltage to the bit line in response to the voltage of the data input/output line so that data "0" is written to the memory cell, or apply a third voltage that is lower than the first voltage to the bit line so that data "1" is written to the memory cell, during a write operation.

The read block may include a transmission gate configured to connect the bit line with a first node in response to a read enable signal, a precharger configured to precharge the first node to the ground voltage and a second node to a precharge voltage in response to a precharge signal and a sensor configured to amplify a signal of the first node and output the amplified signal to the data input/output line.

The sense amplifier may further include an inhibit unit configured to apply the second voltage to the bit line in response to an inhibit signal so that writing of data to the memory cell is prevented.

BRIEF DESCRIPTION OF THE DRAWINGS

Example embodiments are described in further detail below with reference to the accompanying drawings. It should be understood that various aspects of the drawings may have been exaggerated for clarity.

DETAILED DESCRIPTION OF EXAMPLE EMBODIMENTS

Figure 1:
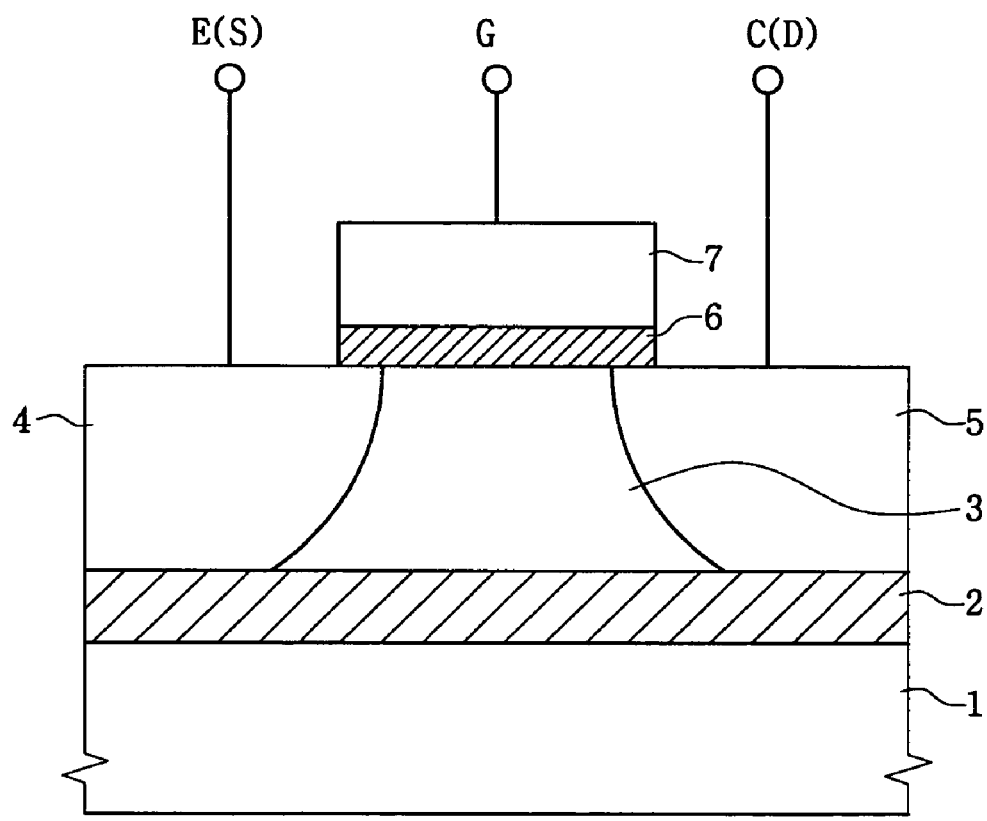
FIG. 1 is a cross-sectional view of a floating body transistor according to an example embodiment.

Example embodiments will now be described more fully with reference to the accompanying drawings. Many alternate forms may be embodied and example embodiments should not be construed as limited to example embodiments set forth herein. In the drawings, the thicknesses of layers and regions may be exaggerated for clarity, and like reference numerals refer to like elements.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. Spatially relative terms, such as "beneath," "below," "lower," "above," "upper" and the like, may be used herein to describe one element or a relationship between a feature and another element or feature as illustrated in the figures. It will be understood that spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation which is above as well as below. The device may be otherwise oriented (rotated 90 degrees or viewed or referenced at other orientations) and the spatially relative descriptors used herein should be interpreted accordingly.

It should also be noted that in some alternative implementations, the functions/operations noted may occur out of the order noted in the figures. For example, two figures shown in succession may in fact be executed substantially concurrently, or may sometimes be executed in reverse order, depending upon the functions/operations involved.

A semiconductor memory device having a memory cell array that includes dynamic memory cells using floating body transistors according to example embodiments is described in detail with reference to the accompanying drawings below.

FIG. 1 is a cross-sectional view of a floating body transistor according to an example embodiment. Referring to FIG. 1, the floating body transistor includes a substrate 1, an insulating layer 2 formed on the substrate 1, a first conductivity type emitter (source) region 4 and a first conductivity type collector (drain) region 5 spaced apart from each other on the insulating layer 2. A floating body region 3 is formed between the spaced-apart emitter (source) and collector (drain) regions 4 and 5 and has a second conductivity type that is different from the first conductivity type. An insulating layer 6 is formed on the floating body region 3 and a gate electrode 7 is formed on the insulating layer 6. The substrate 1 may be a p-type silicon substrate. A semiconductor pattern is formed on the substrate 1. The semiconductor pattern may be made of a semiconductor material such as silicon. The second conductivity type may be p-type. The emitter (source) region 4 formed in each semiconductor pattern is a first impurity region, and the collector (drain) region 5 formed in each semiconductor pattern is a second impurity region. The first and second impurity regions may be the first conductivity type. The first conductivity type may be n-type. Furthermore, gate patterns may be provided on the semiconductor pattern. Each of the gate patterns may include the insulating layer 6 and the gate electrode 7, which are sequentially stacked. The emitter (source) and collector (drain) regions 4 and 5 partially overlap a corresponding gate pattern.

Figure 2:
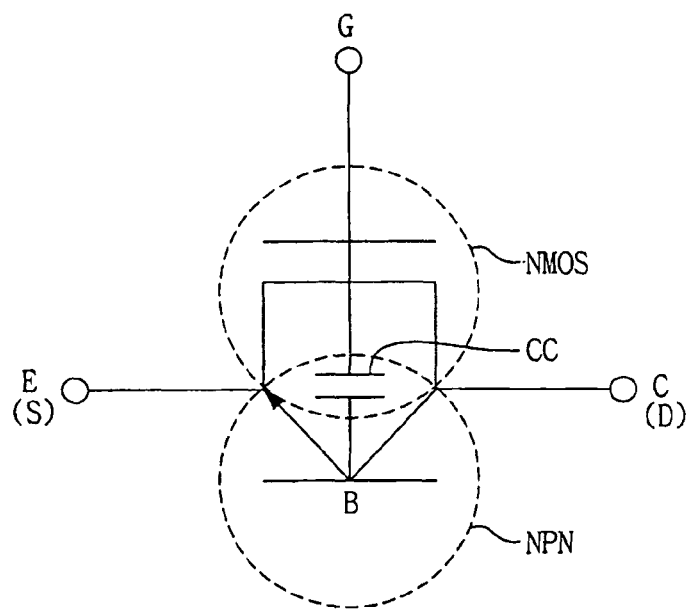
FIG. 2 illustrates a circuit diagram of the floating body transistor shown in FIG. 1 according to an example embodiment.

FIG. 2 is illustrates a circuit diagram of the floating body transistor shown in FIG. 1. The floating body transistor includes an NMOS field effect transistor NMOS (hereinafter, referred to as an "NMOS transistor") and an NPN bipolar junction transistor NPN (hereinafter, referred to as an "NPN transistor"). A source S of the NMOS transistor NMOS and an emitter E of the NPN transistor NPN are shared, and a drain D of the NMOS transistor NMOS and a collector C of the NPN transistor NPN are shared. A base B of the NPN transistor NPN is electrically floated. Furthermore, a coupling capacitor CC exists between a gate G of the NMOS transistor NMOS and the base B of the NPN transistor NPN.

Figure 3:
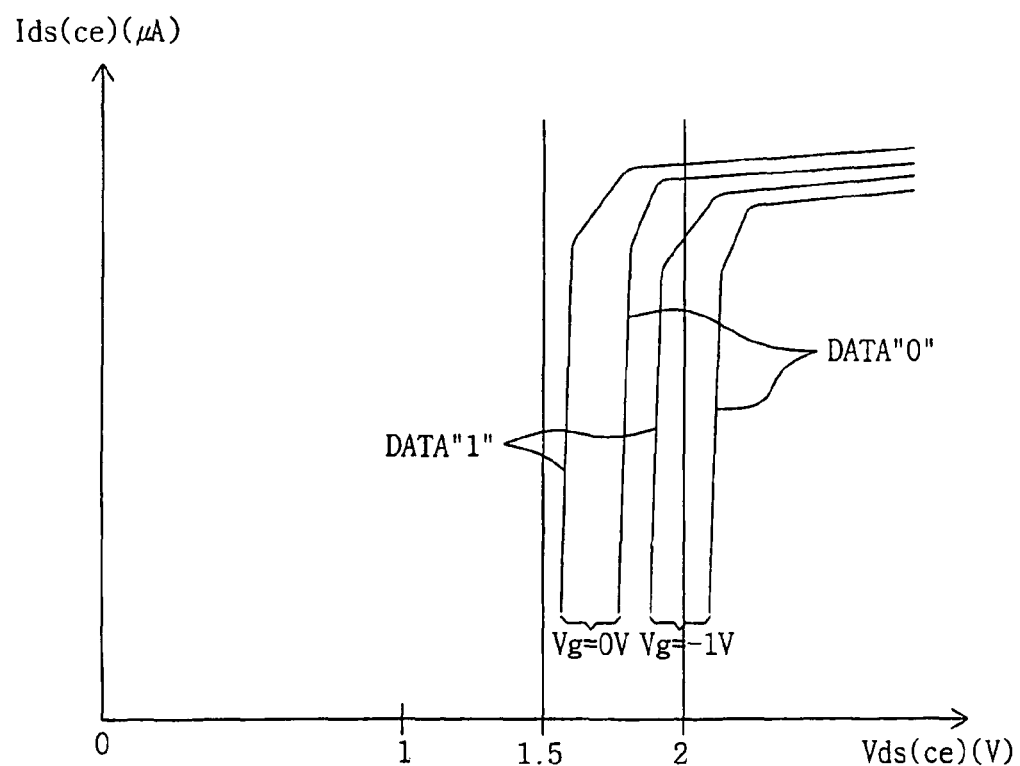
FIG. 3 is a graph showing the DC characteristics of a floating body transistor according to an example embodiment.

FIG. 3 is a graph showing the DC characteristics of a floating body transistor according to an example embodiment. The graph shows variations in current Ids(ce) between the drain D (collector C) and source S (emitter E) of the transistor, which maintains data "1" or "0" (second and first data values, respectively, or vice versa) when a gate voltage Vg is 0V or −1V, versus voltage Vds(ce) between the drain D (collector C) and the source S (emitter E).

In FIG. 3, data "1" means a state in which majority carriers, that is, holes are accumulated in the floating body region 3. In contrast, data "0" means a state in which the majority carriers accumulated in the floating body region 3 is decreased.

From the graph of FIG. 3, when the gate voltage Vg is 0V and when the voltage Vds(ce) is in the range of about 1.5V to about 2V, current is sharply increased regardless of whether the floating body transistor maintains data "1" or data "0". When the voltage difference Vds(ce) reaches a voltage in the range of about 1.5V to about 2V, holes enter the base B of the NPN transistor due to drain coupling at an early stage, so that the potential of the base B of the NPN transistor increases. As a result, a forward voltage is applied between the base B and emitter E of the NPN transistor and thus, emitter current flows. Most of the emitter current flows to the collector C and passes through a band bending region located between the base B and the collector C, causing band-to-band tunneling and/or impact ionization. Due to the band-to-band tunneling and/or the impact ionization, holes are injected from the collector C to the base B and thus, the potential of the base B increases.

When the voltage Vds(ce) increases and the NPN transistor is turned on, the bipolar current Ids(ce) is sharply generated due to the forward feedback system of the NPN transistor. Furthermore, if a multiplication factor attributable to the impact ionization is sufficiently large, the bipolar current Ids(ce) sharply increases due to an avalanche breakdown phenomenon. In this case, data "1" is written by the bipolar current Ids(ce).

In the case where the floating body transistor maintains data "1", the NPN transistor is turned on when a voltage that is lower than the voltage Vds(ce) when data "0" is maintained. Thus, the bipolar current Ids(ce) increases. A high potential is formed in the floating body due to the holes accumulated in the floating body region 3 shown in FIG. 1, so that a forward bias is first applied between the emitter E and the base B. Therefore, the NPN transistor operates rapidly compared to when data "0" is maintained.

In FIG. 3, when the gate voltage Vg is −1V, the bipolar current Ids(ce) is increased at a higher voltage Vds(ce) than when the gate voltage Vg is 0V. The reason the Vds(ce) is higher when the gate voltage Vg is −1V is because the electrostatic potential of the base B is lowered in proportion to the gate voltage Vg, so that the NPN transistor is turned on due to band-to-band tunneling and/or impact ionization when the voltage Vds(ce) is increased if the gate voltage Vg is decreased.

Figure 4:
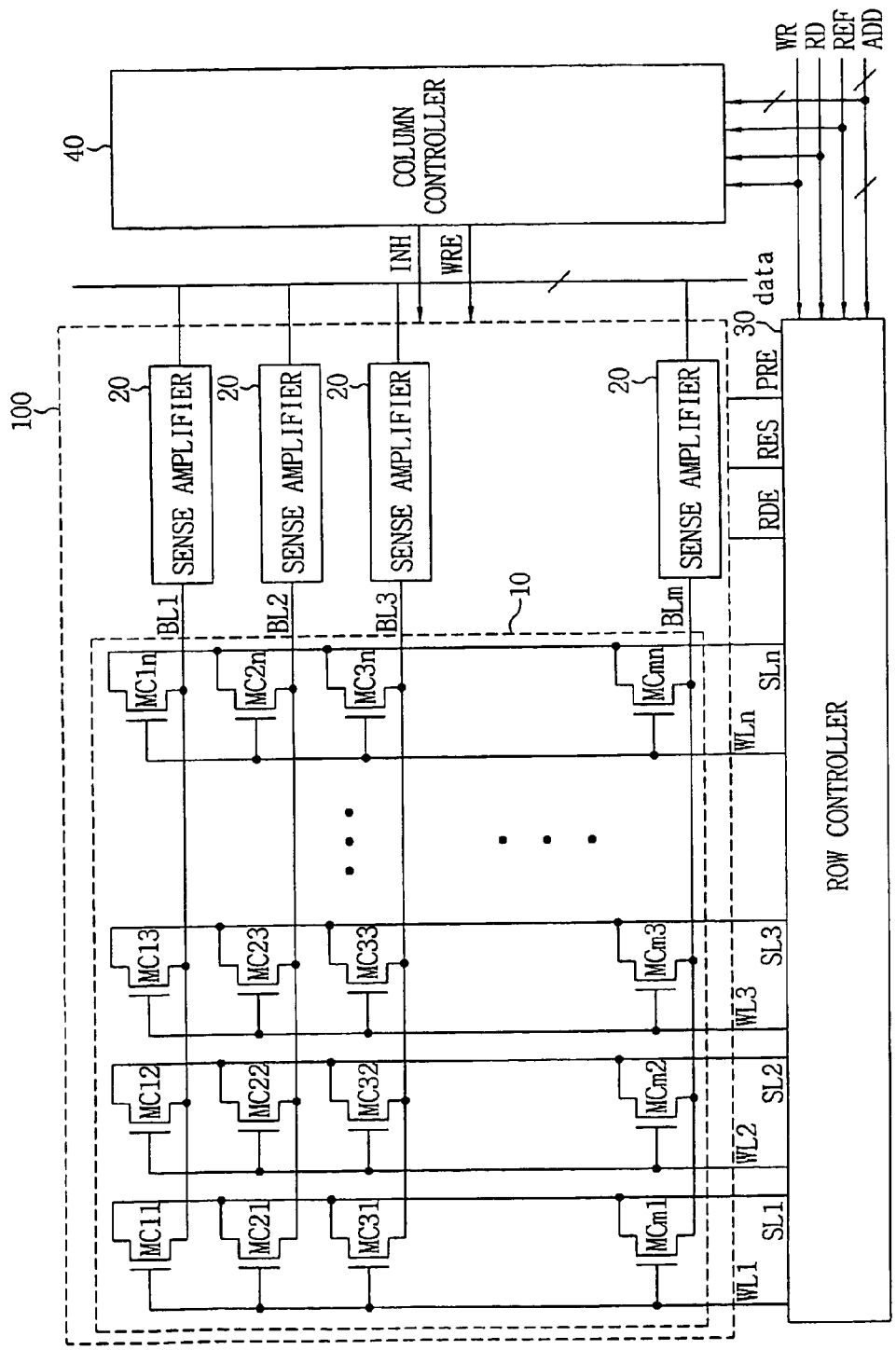
FIG. 4 is a block diagram of a semiconductor memory device including a memory cell array according to an example embodiment.

FIG. 4 is a block diagram of a semiconductor memory device according to an example embodiment. The semiconductor memory device may include a memory cell array 100, a row controller 30, and a column controller 40. The memory cell array 100 may include a memory cell array block 10 and sense amplifiers 20. The memory cell array block 10 may include memory cells MC11, MC12, . . . , MCmn having floating bodies and gates, drains and sources connected to n word lines WL1, WL2, . . . , WLn, m bit lines BL1, BL2, . . . , BLm, and n source lines SL1, SL2, . . . , SLn, respectively. The sense amplifiers 20 may be connected to bit lines BL1, BL2, . . . , BLm, respectively. In FIG. 4, the row controller 30 and the column controller 40 may constitute a single controller. Furthermore, although not shown, the row controller 30 may include a source line decoder, a source line driver, a word line decoder, and a word line driver.

The word lines WL1, WL2, ..., WLn of the memory cell array 100 are arranged parallel to the source lines SL1, SL2, ..., SLn, and the bit lines BL1, BL2, ..., BLm are arranged perpendicular to the word lines WL1, WL2, ..., WLn. Furthermore, the gates of the memory cells MC11, MC12, ..., MCmn of the memory cell array 100 are connected to the corresponding word lines WL1, WL2, ..., WLn, respectively. The sources are connected to the corresponding source lines SL1, SL2, ..., SLn, respectively, and the drains are connected to the corresponding bit lines BL1, BL2, ..., BLm, respectively.

The functions of the respective blocks shown in FIG. 4 are described below.

Data "1"s or "0"s are read from/written to the memory cell array block 10 by causing bipolar current to flow through memory cells or by interrupting the flow of the bipolar current. The sense amplifiers 20 may control the bit lines BL1, BL2, ..., BLm, respectively, in response to a read enable signal RDE, a restore signal RES and a precharge signal PRE which are output from the row controller 30, and an inhibit signal INH and a write enable signal WRE which are output from the column controller 40, so that data are written to/read from the selected memory cells. After a read operation, a restore operation is performed on the memory cells which each store data "0". When a refresh operation is performed, the refresh operation is performed on the memory cells in which data "0"s are stored. Furthermore, the sense amplifiers 20 may prevent data from being written to/read from the non-selected memory cells by controlling the bit lines BL1, BL2, ..., BLm. The row controller 30 may select memory cells by controlling the word lines WL1, WL2, ..., WLn and the source lines SL1, SL2, ..., SLn in response to a write or read signal WR or RD and an address signal ADD. The row controller 30 may output the read enable signal RDE, the restore signal RES and the precharge signal PRE in response to the write signal WR, the read signal RD and a refresh command REF. The column controller 40 may write/read data "1" or "0" to/from the selected memory cells by controlling the bit lines BL1, BL2, ..., BLm in response to the write or read signal WR or RD and the address signal ADD. The column controller 40 may be configured to output the inhibit signal INH so as to prevent data from being written to or read from the non-selected memory cells in response to the write or read signal WR or RD and the address signal ADD. Addresses applied to the row controller 30 may be row addresses, and addresses applied to the column controller 40 may be column addresses.

Figure 5:
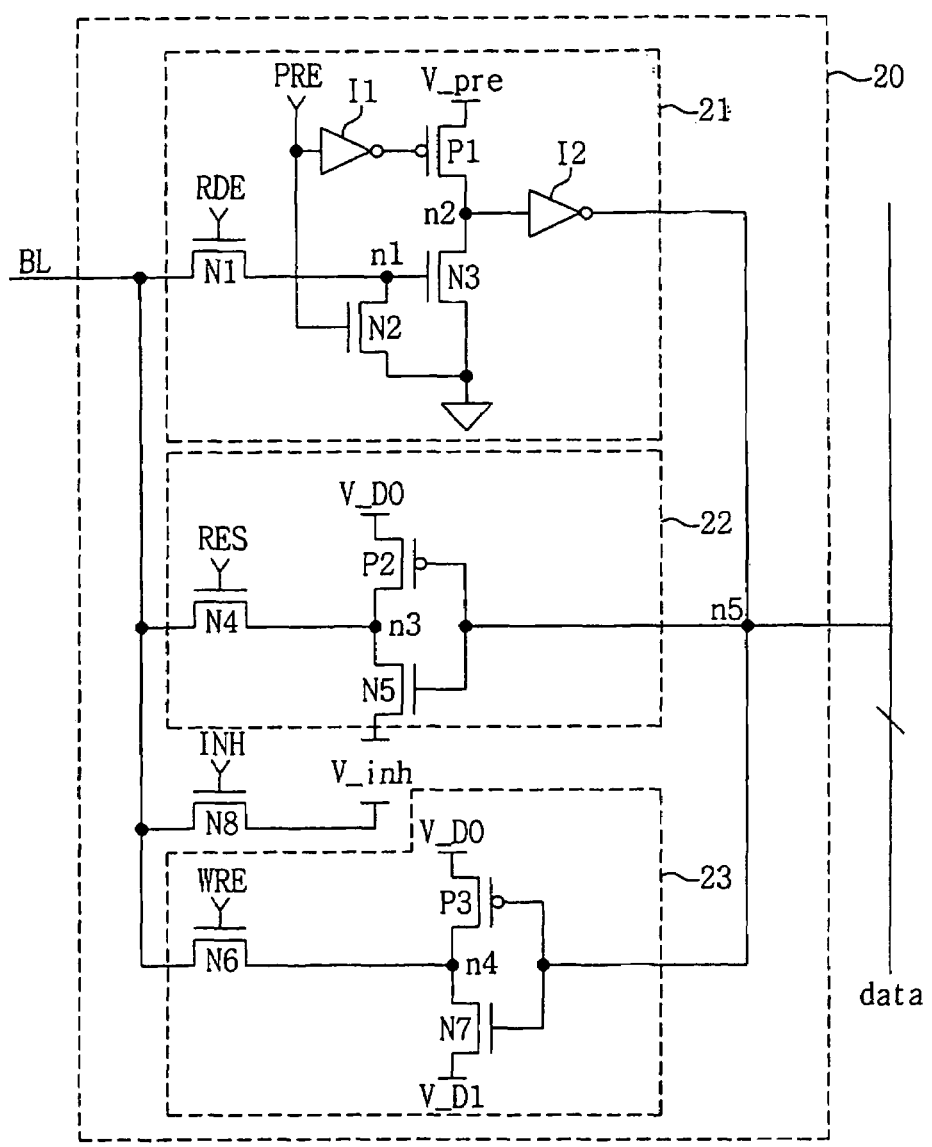
FIG. 5 is a circuit diagram of a sense amplifier of the semiconductor memory device shown in FIG. 4 according to an example embodiment.

FIG. 5 is a circuit diagram of a sense amplifier of the semiconductor memory device shown in FIG. 4. The sense amplifier 20 may include a read block 21, a restore block 22, and a write block 23. A bit line BL, shown in FIG. 5, may correspond to any one of bit lines BL1, BL2, ..., BLm.

Functions of the blocks shown in FIG. 5 are described below.

The read block 21 senses signals from the corresponding bit line BL in response to the read enable signal RDE and the precharge signal PRE, outputs the sensed signals, and precharges the corresponding bit line BL. The read block 21 may include a transmission gate, a precharger, and a sensor. The transmission gate may include a first NMOS transistor N1 connected between the corresponding bit line and a first node n1 and having a gate to which the read enable signal RDE is applied. The precharger may include a first inverter I1 configured to invert the precharge signal PRE and output an inverted precharge signal, a first PMOS transistor P1 connected between a terminal to which a precharge voltage V_pre is applied and a second node n2 and having a gate to which the output of the first inverter I1 is applied, and a second NMOS transistor N2 connected between the first node n1 and a terminal to which the ground voltage is applied and having a gate to which the precharge signal PRE is applied. The sensor may include a third NMOS transistor N3 connected between the second node n2 and a terminal to which the ground voltage is applied and having a gate to which the signal of the first node n1 is applied, and a second inverter I2 connected between the second node n2 and the data input/output line data to output an inverted signal of the second node n2. The transmission gate connects the corresponding bit line BL with the first node n1 based on the read enable signal RDE. The precharger precharges the first node n1 to the ground voltage and a second node n2 to a precharge voltage V_pre based on the precharge signal PRE. The sensor amplifies the signal of the first node n1 and outputs the amplified signal of the first node n1 to the data input/output line data.

The restore block 22 controls the corresponding bit line BL in response to the restore enable signal RES so that the restore or refresh operation can be performed on only the memory cells storing data "0". The restore block 22 may include a fourth NMOS transistor N4 connected between the corresponding bit line BL and a third node n3 and having a gate to which the restore signal RES is applied, a second PMOS transistor P2 connected between the third node n3 and a terminal to which the data "0" state write voltage V_D0 is applied and having a gate to which the signal of the data input/output line data (that is, the signal of a fifth node n5) is applied, and a fifth NMOS transistor N5 connected between the third node n3 and a terminal to which an inhibit voltage V_inh is applied and having a gate to which the signal of the data input/output line data (that is, the signal of a fifth node n5) is applied.

The write block 23 controls the corresponding bit line BL in response to the write enable signal WRE so that data "0"s or "1"s can be written to the selected memory cells. The write block 23 may include a sixth NMOS transistor N6 connected between the corresponding bit line BL and a fourth node n4 and having a gate to which the write enable signal WRE is applied, a third PMOS transistor P3 connected between the fourth node n4 and a terminal to which the data "0" state write voltage V_D0 is applied and having a gate to which a signal of the data input/output line data (that is, the signal of a fifth node n5) is applied, and a seventh NMOS transistor N7 connected between the fourth node n4 and a terminal to which the data "1" state write voltage V_D1 is applied and having a gate to which the signal of data input/output line data (that is, the signal of a fifth node n5) is applied.

Furthermore, the sense amplifier 20 may further include an inhibit unit to prevent data from being written to/read from the non-selected memory cells in response to the inhibit signal INH. The inhibit unit may include an eighth NMOS transistor N8 connected between the corresponding bit line BL and the inhibit voltage V_inh and having a gate to which the inhibit signal INH is applied.

Figure 6:
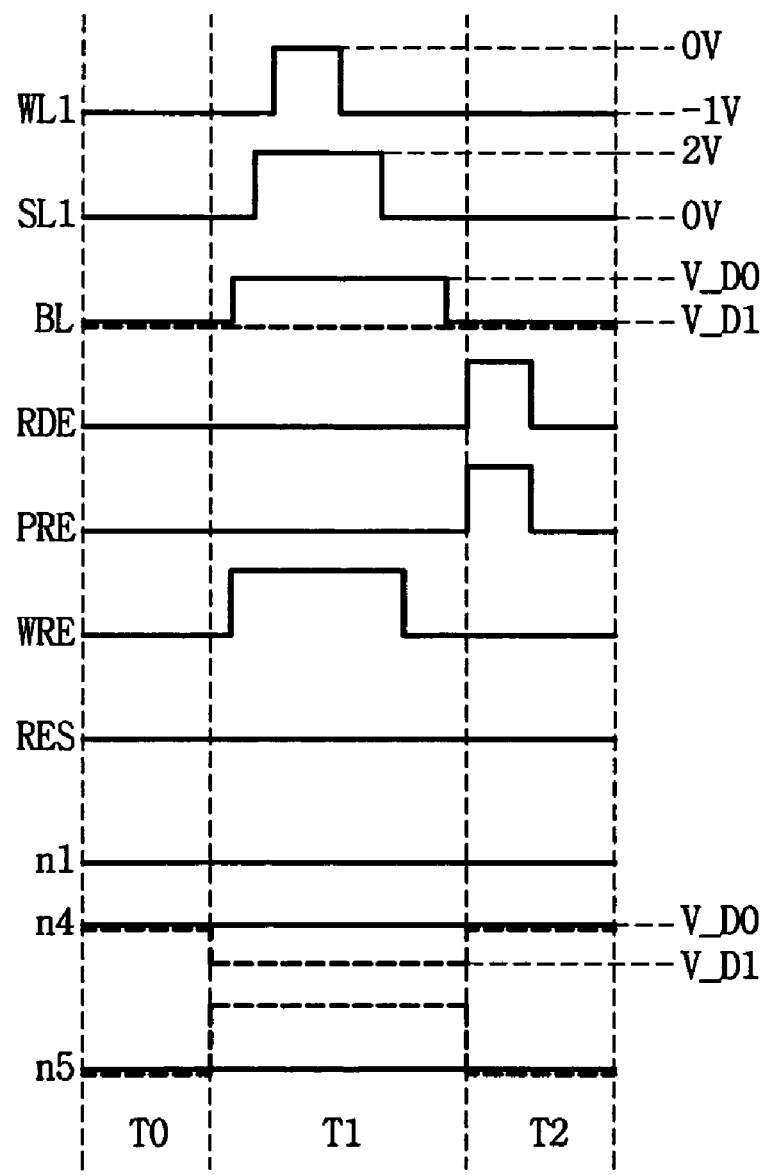
FIG. 6 is a timing diagram illustrating a write operation of the sense amplifier shown in FIG. 5.

FIG. 6 is a timing diagram illustrating the write operation of the sense amplifier shown in FIG. 5. The solid lines denote lines related to writing of data "0" and the dotted lines denote lines related to writing of data "1". The timing diagram of FIG. 6 is obtained when a write operation is performed on all the memory cells that are connected to one selected word line.

The write operation of the sense amplifier 20 is described below in conjunction with the timing diagram of FIG. 6.

First, the operation of writing data "0" to memory cells MC1 may be described below.

In period T1, the row controller 30 selects the memory cells MC11, MC21, ..., MCm1 by applying a voltage of 2V to the source line SL1 and a voltage of 0V to the word line WL1. The row controller 30 outputs a low-level read enable signal RDE, a low-level precharge signal PRE and a low-level restore signal RES. In this case, the column controller 40 outputs a high-level write enable signal WRE. In this case, a low-level signal is input to a data input/output line data and thus, the voltage at node n5 falls to a low level. When the voltage at node n5 is at a low level, a PMOS transistor P3 is turned on but an NMOS transistor N7 is turned off and thus, the voltage at node n4 is in a data "0" state write voltage V_D0 (for example, 0.5 V). In this case, an NMOS transistor N6 is turned on by the high-level write enable signal WRE and thus, the voltage of the corresponding bit line BL is also kept at the data "0" state write voltage V_D0.

For example, if data "0" is stored in the memory cells MC11, MC21, ..., MCm1 in advance, the voltage Vds(ce) of each floating body transistor is 1.5 V. Accordingly, no holes or a small number of holes are discharged from the floating body of each memory cell, and thus, data "0" is maintained. That is, as can be seen from the graph of FIG. 3, the NPN transistor of each memory cell is turned off and thus, the flow of the bipolar current Ids(ce) is almost interrupted. In contrast, if data "1" is stored in the memory cells MC11, MC21, ..., MCm1 in advance, the voltage Vds(ce) of each floating body transistor is 1.5 V. Accordingly, a greater number of accumulated holes than holes injected into the floating body of each memory cell are discharged through the emitter of each memory cell due to weak band-to-band tunneling and/or impact ionization between the base and collector of each memory cell and thus, data "0" is stored in the memory cells MC11, MC21, ..., MCm1. In this manner, the operation of writing data "0" to the memory cells MC11, MC21, ..., MCm1 can be achieved.

Next, the operation of writing data "1" to the memory cells MC11, MC21, ..., MCm1 is described below.

In period T1, the row controller 30 selects the memory cells MC11, MC21, ..., MCm1 by applying a voltage of 2V to the source line SL1 and a voltage of 0V to the word line WL1. The row controller 30 outputs a low-level read enable signal RDE, a low-level precharge signal PRE and a low-level restore signal RES. In this case, the column controller 40 outputs a high-level write enable signal WRE. In this case, a high-level signal is input to the data input/output line data and thus, the voltage at node n5 rises to a high level. When the voltage at node n5 is at a high level, the PMOS transistor P3 is turned off but the NMOS transistor N7 is turned on and thus, the voltage at node n4 is in a data "1" state write voltage V_D1 (for example, 0V). In this case, the NMOS transistor N6 is turned on by the high-level write enable signal WRE and thus, the voltage of the corresponding bit line BL is also kept at the data "1" state write voltage V_D1.

For example, if data "0" is stored in the memory cells MC11, MC21, ..., MCm1 in advance, the voltage Vds(ce) of each floating body transistor is 2V. Accordingly, a large number of holes are injected into the floating body of each memory cell due to strong band-to-band tunneling and/or impact ionization between the base and collector of each memory cell, with the result that the NPN transistor of each memory cell is turned on and thus, bipolar current flows and data "1" is written to the memory cells MC11, MC21, ..., MCm1. In contrast, if data "1" is stored in the memory cells MC11, MC21, ..., MCm1 in advance, the voltage Vds(ce) of each floating body transistor is 2V. Accordingly, band-to-band tunneling and/or impact ionization is caused between the base and collector of each memory cell and thus, data "1" is written to the memory cells. That is, the memory cell according to an embodiment of the inventive concept may perform write operation by current caused by a bipolar junction operation.

As shown in FIG. 6, the voltage of the source line SL1 and the voltage of the word line WL1 rise sequentially, at different times.

Next, the precharge operation will be described.

In period T2, the row controller 30 applies a voltage of −1V to the word line WL1 and a voltage of 2V to the source line SL1 respectively, and then outputs a high-level read enable signal RDE, a high-level precharge signal PRE and a low-level restore signal RES. In this case, the column controller 40 outputs a low-level write enable signal WRE. In this case, the precharge signal PRE is at a high level, so that an NMOS transistor N2 is turned on and thus, the voltage at node n1 falls to a ground voltage. In this case, the read enable signal RDE is also at a high level. Accordingly, an NMOS transistor N1 is turned on, thus, the corresponding bit line BL is precharged to the ground voltage. Furthermore, the precharge signal PRE is at a high level, so that a PMOS transistor P1 is turned on and thus, a node n2 is precharged to a precharge voltage V_pre.

Although not shown, in period T1, the column controller 40 can prevent the data write operation from being performed on the memory cells that are not selected from among the memory cells MC11, MC21, ..., MCm1 connected to both the word line WL1 and the source line SL1 by activating the inhibit signal INH. For example, in the case where the memory cells MC21, MC32, ..., MCm1 are not selected, the column controller 40 can prevent the data write operation from being performed on the memory cells MC21, MC32, ..., MCm1 by activating the inhibit signal INH output to the sense amplifiers that are connected to the bit lines BL2, BL3, ..., BLm. That is, when a high-level inhibit signal INH is applied, an NMOS transistor N8 is turned on and thus, the voltage of the bit line BL is kept at an inhibit voltage V_inh (for example, 1V). Accordingly, a voltage Vds(ce) of 1V is applied of each floating body transistor of memory cells MC21, MC 32, MCm1 and thus, writing of data "0" and "1" to the memory cells can be prevented. That is, if data "1" is written to the memory cells MC21, MC32, and MCm1 in advance, the forward voltage of the NPN transistor of each memory cell MC21, MC32, and MCm1 is not sufficiently high and thus, the holes accumulated in the floating body of each memory cell MC21, MC32, and MCm1 are not discharged. In contrast, if data "0" is written to the memory cells MC21, MC32, and MCm1, no holes are injected into the floating body and thus, writing of data "1" is prevented.

Figure 7:
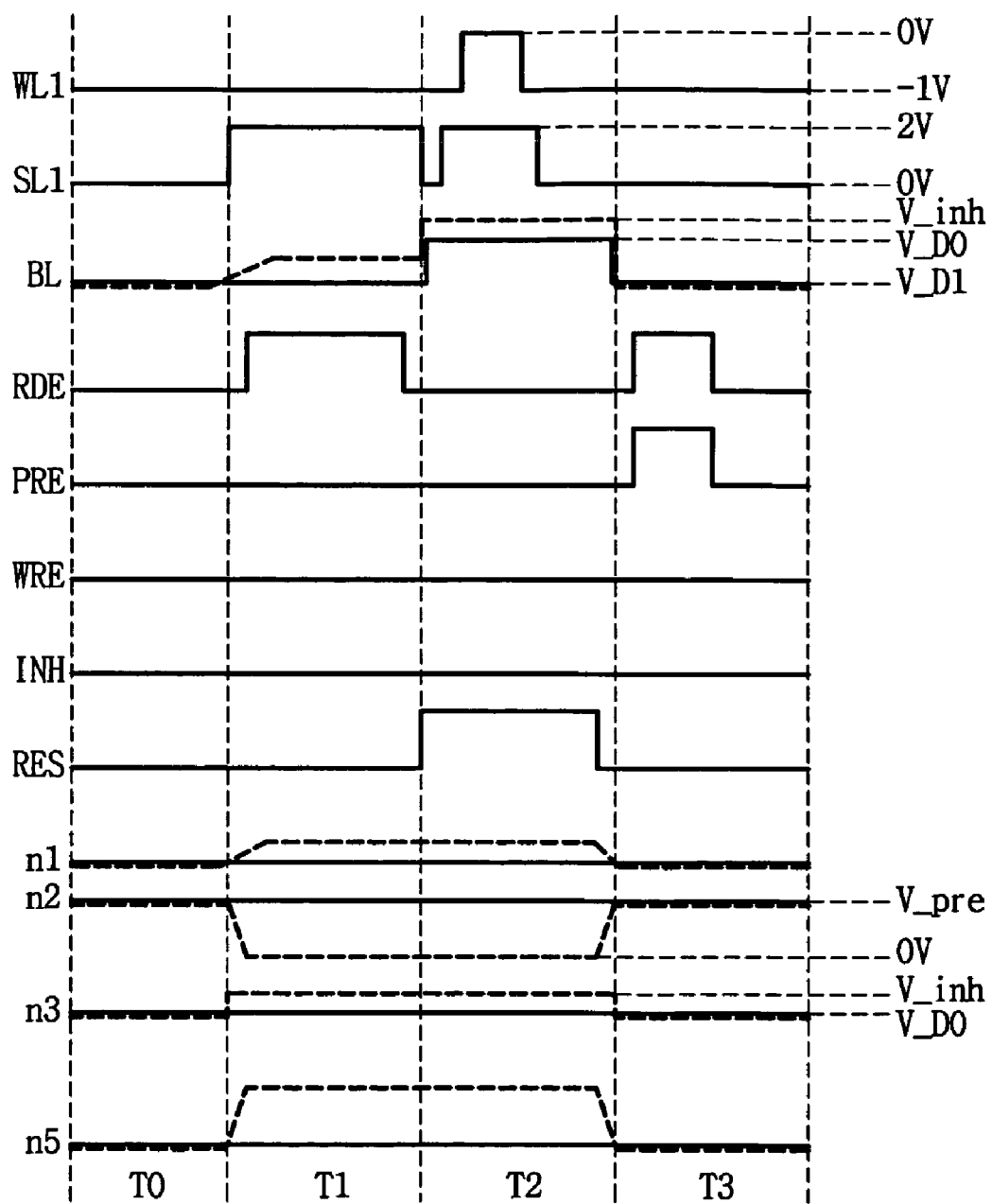
FIG. 7 is a timing diagram illustrating read and restore operations of the sense amplifier shown in FIG. 5.

FIG. 7 is a timing diagram illustrating read and restore operations of the sense amplifier shown in FIG. 5. Solid lines denote lines related to reading and restoration of data "0," and dotted lines denote lines related to reading and restoration of data "1". The timing diagram of FIG. 7 is a timing diagram that is obtained when data read and restore operations are performed on all the memory cells connected to one selected word line.

The read and restore operations of the sense amplifier 20 shown in FIG. 5 are described below in conjunction with the timing diagram of FIG. 7.

In period T1, the row controller 30 selects the memory cells MC11, MC21, MCm1 by applying a voltage of −1V to the word line WL1 and a voltage of 2V to the source line SL1, respectively, and then outputs a high-level read enable signal RDE, a low-level precharge signal PRE, and a low-level restore signal RES. In this case, the column controller 40 outputs a low-level write enable signal WRE. In this case, the bit line BL is precharged to 0V during the previous precharge operation, so that a voltage Vds(ce) of 2V is applied to each floating body transistor of memory cells MC11, MC21, ..., MCm1. Furthermore, the voltage at node n2 is kept at the precharge voltage V_pre due to the previous precharge operation.

If data "0" is stored in the memory cells MC11, MC21, ..., MCm1 in advance, the NPN transistor of each memory cell MC11, MC21, ..., MCm1 is turned off and thus, the flow of bipolar current is interrupted, with the result that the voltage of the corresponding bit line BL is maintained. When the NMOS transistor N1 is turned on by the high-level read enable signal RDE, the voltage at node n1 is kept at the same level as the corresponding bit line BL and thus, the NMOS transistor N3 is turned off. In this case, the voltage at node n2 is kept at the precharge voltage V_pre and thus, the voltage at node n5 falls to a low level.

If data "1" is stored in the memory cells MC11, MC21, ..., MCm1 in advance, the NPN transistor of each memory cell MC11, MC21, ..., MCm1 is turned on and thus, bipolar current flows from the source to the drain of each memory MC11, MC21, ..., MCm1. Accordingly, the corresponding bit line BL is charged and its voltage increases. When the NMOS transistor N1 is turned on by the high-level read enable signal RDE, the voltage at node n1 is kept at the same level as the bit line BL and thus, the NMOS transistor N3 is turned on. In this case, the voltage at node n2 decreases and the voltage at node n5 rises to a high level. The voltage at node n5 is transmitted to the data input/output line data. That is, the memory cell according to an embodiment of the inventive concept may perform read operation by current caused by a bipolar junction operation.

In period T2, the row controller 30 selects the memory cells MC11, MC21, ..., MCm1 by applying a voltage of 0V to the word line WL1 and a voltage of 2V to the source line SL1 respectively, and outputs a low-level read enable signal RDE, a low-level precharge signal PRE and a high-level restore signal RES. In this case, the column controller 40 outputs a low-level write enable signal WRE.

If data "0" is stored in the memory cells MC11, MC21, ..., MCm1 in advance, the voltage at node n5 falls to low level. A PMOS transistor P2 is turned on but an NMOS transistor N3 is turned off and thus, the voltage at node n3 is in a data "0" state write voltage V_D0 (for example, 0.5 V). In this case, the restore signal RES is kept at a high level, so that an NMOS transistor N4 is turned on, and the voltage of the bit line BL is also kept at a data "0" write voltage level. Accordingly, data "0" is restored to the memory cells MC11, MC21, ..., MCm1. Thus, the process of restoring data "0" to the memory cells MC11, MC21, ..., MCm1 is described.

If data "1" is stored in the memory cells MC11, MC21, ..., MCm1 in advance, the voltage at node n5 rises to a high level as described above. In this case, the PMOS transistor P2 is turned off but the NMOS transistor N5 is turned on and thus, the voltage at node n3 is kept at an inhibit voltage V_inh (for example, 1V). In this case, the restore signal RES is kept at a high level, so that the NMOS transistor N4 is turned on and thus, the voltage of the bit line BL is also kept at the inhibit voltage V_inh. Accordingly, the process of restoring data "1" to the memory cells MC11, MC21, ..., MCm1 is not performed. Thus, the prevention of the data write operation is described.

In period T3, the row controller 30 applies a voltage of −1V to the word line WL1 and a voltage of 0V to the source line SL1, and outputs a high-level read enable signal RDE, a high-level precharge signal PRE, and a low-level restore signal RES. In this case, the column controller 40 outputs a low-level write enable signal WRE. Accordingly, the bit line BL is precharged to the ground voltage and node n2 is precharged to the precharge voltage V_pre.

Although not shown, the column controller 40 may prevent the data read operation from being performed on the memory cells that are not selected from among the memory cells MC11, MC21, ..., MCm1 connected to the word line WL1 and the source line SL1, by activating the inhibit signal INH in period T1.

The semiconductor memory device according to the present example embodiment may be configured to perform a refresh operation by performing the read and restore operations described with reference to FIG. 7. That is, when a refresh period is started or when a refresh command REF is received, the row controller 30 sequentially controls the word lines WL1, WL2, ..., WLn and the source lines SL1, SL2, ..., SLn, and outputs a read enable signal and a restore signal, thus, sequentially performing read and restore operations on the memory cells MC11, MC21, ..., MCnm. In this manner, the semiconductor memory device may be configured to perform a refresh operation.

Although the semiconductor memory device according to the above-described example embodiment is implemented in such a way that the gate, source and drain of the floating body transistor of each memory cell are connected to a corresponding word line, a corresponding source line and a corresponding bit line, respectively, the semiconductor memory device may be implemented in such a way that the floating body transistors of two neighboring memory cells have a common drain that is connected to a corresponding bit line, and a common source that is connected to a corresponding source line.

In a semiconductor memory device including a memory cell array that has dynamic memory cells using floating body transistors according to example embodiments, a restore or refresh operation can be selectively performed on only a memory cell in which data "0" is stored.

While example embodiments have been disclosed for illustrative purposes, those skilled in the art will appreciate that various modifications, additions and substitutions are possible without departing from the spirit and scope as defined by the accompanying claims.

What is claimed is:

1. A semiconductor memory device, comprising:
   a memory cell array including,
      a memory cell array block having a plurality of memory cells connected between a plurality of word lines, a plurality of source lines and a plurality of bit lines and having floating body transistors, and
      a plurality of sense amplifiers connected to the plurality bit lines, each of the plurality of sense amplifiers being configured to amplify a signal of the corresponding bit line and output the amplified signal to a data input/output line, apply, based on a restore signal, a first voltage to a corresponding bit line to restore a first data value in a selected memory cell of the plurality of memory cells if a state of the data input/output line is a state corresponding to the first data value and apply a second voltage based on the restore signal to the corresponding bit line to prevent a second data value from being restored in the selected memory cell if the state of the data input/output line is a state corresponding to the second data value.

2. The semiconductor memory device of claim 1, wherein the second voltage is higher than the first voltage.

3. The semiconductor memory device of claim 1, wherein each of the plurality of sense amplifiers is configured to apply a third voltage that is lower than the first voltage to the corresponding bit line so that the second data value is written to the selected memory cell.

4. The semiconductor memory device of claim 3, wherein each of the memory cells is configured such that data is written thereto and read therefrom by current caused by a bipolar junction operation.

5. The semiconductor memory device of claim 3, wherein each of the plurality of sense amplifiers includes,
 a read block configured to amplify a voltage of the corresponding bit line and output the amplified voltage to the data input/output line in response to a read enable signal and precharge the corresponding bit line to a ground voltage in response to the read enable signal and a precharge signal,
 a restore block configured to apply the first or second voltage to the corresponding bit line based on the voltage of the data input/output line and the restore signal, and
 a write block configured to apply the first or third voltage to the corresponding bit line based on the voltage of the data input/output line and a write enable signal.

6. The semiconductor memory device of claim 5, wherein the read block includes,
 a transmission gate configured to connect the corresponding bit line with a first node based on the read enable signal,
 a precharger configured to precharge the first node to the ground voltage and a second node to a precharge voltage based on the precharge signal, and
 a sensor configured to amplify a signal of the first node and output the amplified signal of the first node to the data input/output line.

7. The semiconductor memory device of claim 6, wherein the precharger includes,
 a second NMOS transistor connected between the first node and a terminal to which the ground voltage is applied to and having a gate to which the precharge signal is applied,
 a first inverter configured to invert and output an inverted precharge signal, and
 a first PMOS transistor connected between a terminal to which the precharge voltage is applied to and the second node and having a gate to which the output of the first inverter is applied.

8. The semiconductor memory device of claim 6, wherein the sensor includes,
 a third NMOS transistor connected between the second node and a terminal to which the ground voltage is applied and having a gate to which the signal of the first node is applied, and
 a second inverter connected between the second node and the data input/output line to output an inverted signal of the second node.

9. The semiconductor memory device of claim 5, wherein the restore block includes,
 a fourth NMOS transistor connected between the corresponding bit line and a third node and having a gate to which the restore signal is applied;
 a second PMOS transistor connected between the third node and a terminal to which the first voltage is applied and having a gate to which a signal of the data input/output line is applied; and
 a fifth NMOS transistor connected between the third node and a terminal to which the second voltage is applied and having a gate to which the signal of the data input/output line is applied.

10. The semiconductor memory device of claim 5, wherein the write block includes,
 a sixth NMOS transistor connected between the corresponding bit line and a fourth node and having a gate to which the write enable signal is applied;
 a third PMOS transistor connected between the fourth node and a terminal to which the first voltage is applied and having a gate to which a signal of the data input/output line is applied; and
 a seventh NMOS transistor connected between the fourth node and a terminal to which the third voltage is applied and having a gate to which the signal of data input/output line is applied.

11. The semiconductor memory device of claim 5, further comprising:
 a controller configured to control the plurality of word lines and the plurality of source lines in response to a write command, a read command, and an address signal received from outside, and output the read enable signal, the precharge signal, the write enable signal, and the restore signal.

12. The semiconductor memory device of claim 11, wherein the controller is configured to,
 apply a fourth voltage to a selected word line, apply a fifth voltage that is higher than the fourth voltage to a selected source line, and activate the write enable signal during a first period for a write operation, and
 apply a sixth voltage that is lower than the fourth voltage to the selected word line, apply the fourth voltage to the selected source line, and activate the read enable signal and the precharge signal during a second period for the write operation.

13. The semiconductor memory device of claim 12, wherein the controller is configured to,
 apply the sixth voltage to the selected word line, apply the fifth voltage to the selected source line, and activate the read enable signal during a first period for read and restore operations,
 apply the fourth voltage to the selected word line, apply the fifth voltage to the selected source line, and activate the restore signal during a second period for the read and restore operations, and
 apply the sixth voltage that is lower than the fourth voltage to the selected word line, apply the fourth voltage to the selected source line, and activate the read enable signal and the precharge signal during a third period for the read and restore operations.

14. The semiconductor memory device of claim 13, wherein the controller is configured to sequentially perform the read and restore operations on memory cells that are connected to one or more word lines among the plurality of word lines when a refresh command is activated or when a refresh period is started.

15. The semiconductor memory device of claim 5, wherein each of the plurality of sense amplifiers is configured to prevent data from being written to the corresponding memory cell by applying the second voltage to the corresponding bit line in response to an inhibit signal.

16. The semiconductor memory device of claim 15, wherein each of the plurality of sense amplifiers includes an eighth NMOS transistor connected between the corresponding bit line and a terminal to which the second voltage is applied and having a gate to which the inhibit signal is applied.

17. The semiconductor memory device of claim 15, wherein the controller is configured to output the inhibit signal to one of the plurality of sense amplifiers connected to a bit line of at least one non-selected memory cell during the write operation.

18. A sense amplifier, comprising:
- a read block configured to amplify a voltage of a bit line connected to a memory cell having a floating body transistor and output the amplified voltage to a data input/output line during a read operation, and precharge the bit line to a ground voltage during a precharge operation;
- a restore block configured to apply a first voltage to the bit line based on a voltage of the data input/output line to restore a first data value in the memory cell, or apply a second voltage that is higher than the first voltage to the bit line to prevent restoring a second data value in the memory cell; and
- a write block configured to apply the first voltage to the bit line based on the voltage of the data input/output line to write a first data value to the memory cell, or apply a third voltage that is lower than the first voltage to the bit line to write a second data value to the memory cell, during a write operation.

19. The sense amplifier of claim 18, wherein the read block comprises:
- a transmission gate configured to connect the bit line with a first node in response to a read enable signal;
- a precharger configured to precharge the first node to the ground voltage and a second node to a precharge voltage in response to a precharge signal; and
- a sensor configured to amplify a signal of the first node and output the amplified signal of the first node to the data input/output line.

20. The sense amplifier of claim 18, further comprising:
- an inhibit unit configured to apply the second voltage to the bit line based on an inhibit signal so that writing of data to the memory cell is prevented.

* * * * *